United States Patent
Knapp et al.

(10) Patent No.: US 12,392,865 B2
(45) Date of Patent: Aug. 19, 2025

(54) TRANSMIT POWER REDUCTION FOR RADIO FREQUENCY TRANSMITTERS

(71) Applicant: Infineon Technologies AG, Neubiberg (DE)

(72) Inventors: Herbert Knapp, Munich (DE); Hao Li, Poing (DE)

(73) Assignee: Infineon Technologies AG, Neubiberg (DE)

( * ) Notice: Subject to any disclaimer, the term of this patent is extended or adjusted under 35 U.S.C. 154(b) by 624 days.

(21) Appl. No.: 17/547,907

(22) Filed: Dec. 10, 2021

(65) Prior Publication Data

US 2023/0184885 A1 Jun. 15, 2023

(51) Int. Cl.
*G01S 7/35* (2006.01)
*G01S 13/32* (2006.01)
*H03F 3/24* (2006.01)

(52) U.S. Cl.
CPC ............... *G01S 7/35* (2013.01); *G01S 7/358* (2021.05); *H03F 3/245* (2013.01); *G01S 13/325* (2013.01); *H03F 2200/451* (2013.01)

(58) Field of Classification Search
CPC .......... G01S 7/35; G01S 7/358; G01S 13/325; H03F 3/245; H03F 2200/451
See application file for complete search history.

(56) References Cited

U.S. PATENT DOCUMENTS

| 7,616,678 | B2 * | 11/2009 | Cangiani | H04L 27/2003 370/335 |
| 11,460,572 | B2 * | 10/2022 | Pedross-Engel | H04L 27/20 |
| 2004/0102207 | A1 * | 5/2004 | Wenzel | H04W 52/52 455/69 |
| 2005/0153675 | A1 * | 7/2005 | Yoon | H04B 1/707 455/302 |

(Continued)

FOREIGN PATENT DOCUMENTS

CN 109216834 A * 1/2019 ........... G01S 13/288

OTHER PUBLICATIONS

Ng et al., "Low Phase Noise 77-GHz Fractional-N PLL with DLL-based Reference Frequency Multiplier for FMCW Radars," Proceedings of the 6th European Microwave Intefrated Circuits Conference, Oct. 10-11, 2011, Manchester, UK, pp. 196-199, 4 pages total.

*Primary Examiner* — William Kelleher
*Assistant Examiner* — Noah Yi Min Zhu
(74) *Attorney, Agent, or Firm* — Slater Matsil, LLP

(57) ABSTRACT

A method of operating a monolithic microwave integrated circuit (MMIC) in a radar transmitter includes: sending a radio frequency (RF) signal to a power amplifier of the radar transmitter, where the power amplifier is controlled by a termination control signal, where when the termination control signal is de-asserted, the power amplifier is configured to pass the RF signal through the power amplifier for transmission by an RF antenna, where when the termination (Continued)

control signal is asserted, the power amplifier is configured to terminate the RF signal in the power amplifier; transmitting the RF signal by de-asserting the termination control signal; and after de-asserting the termination control signal, disabling transmission of the RF signal by: reducing a power of the RF signal; and asserting the termination control signal.

22 Claims, 11 Drawing Sheets

(56) References Cited

U.S. PATENT DOCUMENTS

| | | | | |
|---|---|---|---|---|
| 2006/0098762 | A1* | 5/2006 | Wojtiuk | H03C 3/0933 |
| | | | | 375/308 |
| 2009/0264145 | A1* | 10/2009 | Kazakevich | H03F 1/02 |
| | | | | 455/522 |
| 2012/0327961 | A1* | 12/2012 | Poon | H01S 3/10038 |
| | | | | 372/26 |
| 2015/0023450 | A1* | 1/2015 | Rozenblit | H03F 3/19 |
| | | | | 375/295 |
| 2020/0067187 | A1* | 2/2020 | Reynolds | B64F 1/362 |
| 2020/0144993 | A1* | 5/2020 | Saha | H04B 7/0617 |
| 2022/0196795 | A1* | 6/2022 | Wu | G01S 7/354 |
| 2022/0196796 | A1* | 6/2022 | Fiore | G01S 13/581 |
| 2022/0399864 | A1* | 12/2022 | Elsayed | H03F 3/45179 |

* cited by examiner

TRANSMIT POWER REDUCTION FOR RADIO FREQUENCY TRANSMITTERS

TECHNICAL FIELD

The present invention relates generally to systems and methods for transmit power reduction for radio frequency (RF) transmitters.

BACKGROUND

Applications in the millimeter-wave frequency regime have gained significant interest in the past few years due to the rapid advancement in low cost semiconductor technologies such as silicon germanium (SiGe) and fine geometry complementary metal-oxide semiconductor (CMOS) processes. Availability of high-speed bipolar and metal-oxide semiconductor (MOS) transistors has led to a growing demand for integrated circuits for millimeter-wave applications at, e.g., 60 GHZ, 77 GHz, and 80 GHz, or even beyond 100 GHz. Such applications include, for example, automotive radar systems and multi-gigabit communication systems.

Radar is used for different applications such as target identification/tracking, positioning, monitoring of physical conditions, or motion/gesture sensing. Radar systems using radio frequency integrated circuits (RFICs), such as monolithic microwave integrated circuits (MMICs), have been widely deployed in autonomous driving vehicles. In a frequency-modulated continuous-wave (FMCW) radar system, the transmitted RF signal includes a plurality of frames, where each frame is a frequency ramp signal (also referred to as a chirp signal). During the short periods of time between adjacent frames of chirp signals, transmission of the RF signal may need to be stopped. Simply turning off the RF transmitter during the short periods of time may cause performance issues. There is need in the art for improved RF systems and methods of operation that could stop transmission of the RF signal quickly in short periods of time without causing performance issues for the RF system.

SUMMARY

In accordance with an embodiment, a method of operating a radar transmitter includes: supplying a first radio frequency (RF) signal to a phase shifter, wherein the phase shifter comprises an in-phase (I) component RF path and a quadrature (Q) component RF path, wherein the I-component RF path and the Q-component RF path are configured to generate a phase shift to the first RF signal according to a first scale factor of the I-component RF path and a second scale factor of the Q-component RF path, wherein the phase shifter is configured to generate a second RF signal at an output terminal of the phase shifter, wherein the output terminal of the phase shifter is coupled to an input terminal of a power amplifier of the radar transmitter; generating an enable signal for the power amplifier; passing the second RF signal from the phase shifter through the power amplifier by setting the enable signal for the power amplifier to a first value; setting the enable signal for the power amplifier to a second value to reduce a gain of the power amplifier; and based on setting the enable signal to the second value, reducing a power of the second RF signal by setting the first scale factor of the I-component RF path and the second scale factor of the Q-component RF path.

In accordance with an embodiment, a method of operating a monolithic microwave integrated circuit (MMIC) in a radar transmitter includes: sending a radio frequency (RF) signal to a power amplifier of the radar transmitter, wherein the power amplifier is controlled by a termination control signal, wherein when the termination control signal is de-asserted, the power amplifier is configured to pass the RF signal through the power amplifier for transmission by an RF antenna, wherein when the termination control signal is asserted, the power amplifier is configured to terminate the RF signal in the power amplifier; transmitting the RF signal by de-asserting the termination control signal; and after de-asserting the termination control signal, disabling transmission of the RF signal by: reducing a power of the RF signal; and asserting the termination control signal.

In accordance with an embodiment, a radar transmitter includes: a phase shifter configured to receive a first radio frequency (RF) signal at an input terminal of the phase shifter, and configured to generate a second RF signal at an output terminal of the phase shifter, wherein the phase shifter comprises an in-phase (I) component RF path and a quadrature (Q) component RF path, wherein the I-component RF path and the Q-component RF path are configured to generate a phase shift to the first RF signal according to a first scale factor for the I-component RF path and a second scale factor for the Q-component RF path; a power amplifier coupled to the output terminal of the phase shifter, wherein a control terminal of the power amplifier is configured to receive a termination control signal, wherein when the termination control signal is de-asserted, the power amplifier is configured to pass the second RF signal through the power amplifier for transmission by an antenna, wherein when the termination control signal is asserted, the power amplifier is configured to terminate the second RF signal; and a frequency control circuit, wherein the frequency control circuit is configured to generate the first scale factor, the second scale factor, and the termination control signal, wherein the frequency control circuit is configured to enable transmission of the second RF signal by: assigning a first value and a second value to the first scale factor and the second scale factor, respectively; and de-asserting the termination control signal; and configured to disable transmission of the second RF signal by: reducing the first value to zero and reducing the second value to zero; and asserting the termination control signal.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EXAMPLES

Figure 1:
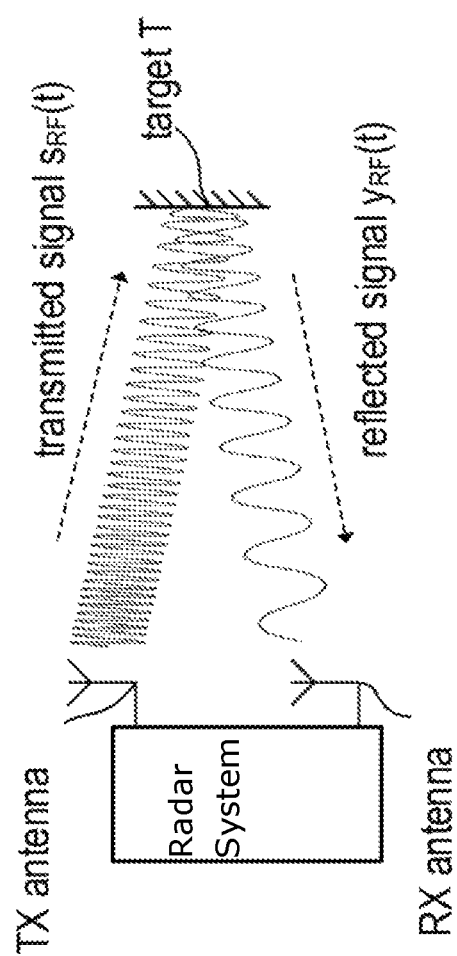
FIG. 1 illustrates a block diagram of a radar system, in an embodiment.

The making and using of the presently disclosed examples are discussed in detail below. It should be appreciated, however, that the present invention provides many applicable inventive concepts that can be embodied in a wide variety of specific contexts. The specific examples discussed are merely illustrative of specific ways to make and use the invention, and do not limit the scope of the invention. Throughout the discussion herein, unless otherwise specified, the same or similar reference numerals in different figures refer to the same or similar component.

The present disclosure will be described with respect to examples in a specific context, namely transmitter power reduction for the RF transmitter of an FMCW radar system. One skilled in the art will readily appreciate that the principle disclosed herein may be applied to RF transmitters in other system besides FMCW radar system.

FIG. 1 illustrates the working principle of a frequency-modulated continuous-wave (FMCW) radar system, in an example. In the illustrated example of FIG. 1, the FMCW radar system transmits a radio frequency (RF) signal, which is a frequency-modulated continuous-wave signal, using one or more transmit (Tx) antennas. The transmitted RF signal bounces back from a target, and is received by the FMCW radar system using one or more receive (Rx) antennas. In FMCW radar systems, the frequency difference between the received RF signal and the transmitted RF signal increases proportionally with the time delay between the transmitted and received RF signals. Therefore, the distance between the FMCW radar system and the target can be determined by finding the frequency difference between the transmitted and received RF signals.

Figure 2:
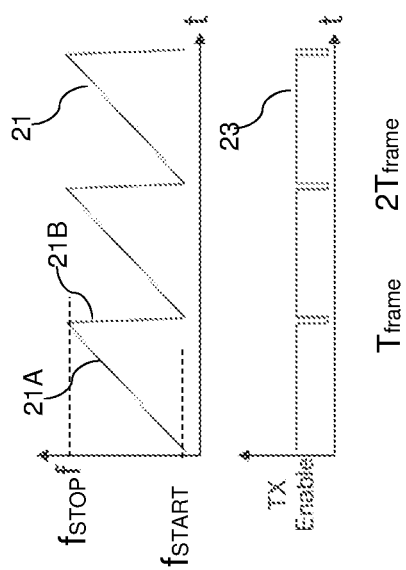
FIG. 2 illustrates an RF signal of a frequency-modulated continuous-wave (FMCW) radar system, in an embodiment.

FIG. 2 illustrates an RF signal 21 of an FMCW radar system, in an embodiment. In FIG. 2, two subplots are illustrated. The top subplot shows the frequency of the RF signal 21 (e.g., an FWCW signal) over a plurality of frames, where each frame has a duration of $T_{frame}$. Each frame of the RF signal includes a frequency ramp signal 21A, with the frequency of the RF signal 21 changes (e.g., increases) linearly from a first frequency (e.g., $f_{START}$) to a second frequency (e.g., $f_{STOP}$), as illustrated in FIG. 2. The frequency ramp signal 21A within each frame is also referred to as a chirp signal. Within each frame, a fly-back signal 21B is generated after the frequency ramp signal 21A in a short period of time (referred to as a fly-back period), during which the frequency of the RF signal 21 drops quickly from $f_{STOP}$ back to $f_{START}$. In FMCW radar systems, transmission of the RF signal 21 may be disabled during the fly-back periods. The lower subplot of FIG. 2 shows a Tx enable signal 23 for enabling (e.g., allowing) or disabling (e.g., stopping) transmission of the RF signal 21. In the example of FIG. 2, the Tx enable signal 23 is de-asserted (e.g., having a logic low value) during the fly-back periods, which instructs the RF transmitter of the FMCW radar system to stop transmission of the RF signal 21 during the fly-back periods. Note that since FIG. 2 illustrates the frequency component of the RF signal 21, the RF signal 21 in FIG. 2 may represent RF signal 114 or 126 discussed hereinafter. In the example of FIG. 2, the frequency ramp signal 21A is shown as having an increasing frequency, and the fly-back signal 21B is shown as having a decreasing frequency. In other embodiments, the frequency ramp signal 21A has a decreasing frequency, and the fly-back signal 21B has an increasing frequency. In some embodiments, the frequencies of the frequency ramp signal 21A and the flay-back signal 21B change (e.g., increase, or decrease) non-linearly.

Figure 3:
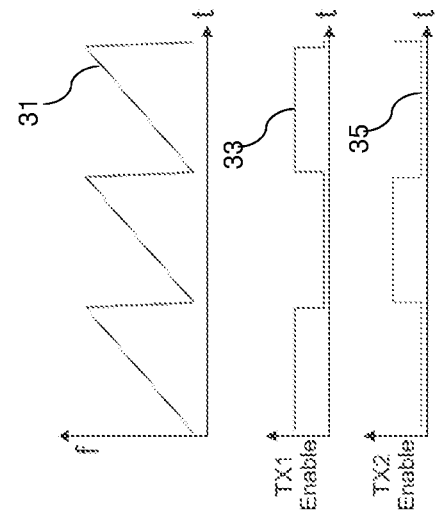
FIG. 3 illustrates an RF signal of an FMCW radar system, in another embodiment.

Besides the fly-back periods, the FMCW radar system may stop transmission of the RF signal during other periods of time. An example is illustrated in FIG. 3. In the example of FIG. 3, the FMCW radar system has multiple Tx channels, with each Tx channel producing an RF signal for a respective Tx antenna coupled to the Tx channel. The top subplot of FIG. 3 shows an RF signal 31 in one of the Tx channels, which is the same as the RF signal 21 in FIG. 2. In some applications, the FMCW radar system may sweep the Tx antennas by transmitting an RF signal 31 from the first Tx antenna while the other Tx antennas remain idle (e.g., not transmitting RF signals), then transmitting from the second Tx antenna while other Tx antennas remain idle, and so on. The curve 33 in the middle subplot and the curve 35 in the lower subplot of FIG. 3 show two Tx enable signals (e.g., Tx1 Enable and Tx2 Enable), which are asserted (e.g., having a logic high value) alternately, such that while Tx antenna 1 is transmitting the RF signal, the Tx antenna 2 is idle, and vice versa.

A simplistic method for disabling transmission of the RF signal is to turn off (also referred to as de-activate, or switch off) the power amplifier(s) of the RF transmitter by turning off (e.g., stopping) the supply current(s) to the power amplifier(s). However, such a simplistic method may cause performance issues, as discussed below.

The efficiency of the power amplifiers in the radar frequency range (e.g., around 77 GHz) is normally low. Typically, power amplifiers in the output stage of the RF transmitter require operating currents in the range of 100 mA or more. The duration of the frequency ramp signal (e.g., 21A) in the FWCM radar system is typically several tens of microseconds (e.g., 40 μs). The fly-back period between adjacent frequency ramp signals should be as short as possible, typically only a few microseconds, or a few hundred nanoseconds. Deactivating the power amplifier during the fly-back periods means turning off the supply current for the power amplifiers quickly during the short fly-back periods, then turning the supply current back on again. The large change of supply current within a short time leads to overshoot and undershoot of the supply voltage of the RF transmitter, because the voltage regulators of the RF transmitter cannot react infinitely fast and have a certain settling time. The overshoot and undershoot of the supply voltage may lead to reliability issues and may lead to malfunction of the devices in the FWMC radar system. In addition, ripples on the power supply may have an impact on the spectral purity of the transmitted RF signal.

Furthermore, in an RF transmitter with multiple Tx channels, switching power amplifiers in different Tx channels on and off has an impact on the temperature distribution on the semiconductor chip (e.g., an MMIC) comprising the RF transmitter. For example, when a first Tx channel is switched off and a second Tx channel is switched on, the area on the semiconductor chip corresponding to the first Tx channel may have a lower temperature than the area corresponding to the second Tx channel. In radar applications, the relative phases (e.g., phase differences) between the Tx channels of the RF transmitter are important. Local changes in chip temperature may lead to unwanted variations of Tx phases in the Tx channels. Therefore, an RF transmitter that could disable transmission of the RF signal without changing (e.g., turning off) the supply current to the power amplifier is needed to avoid the above discussed issues. Various embodiments of RF transmitter that allows for disabling transmission of RF signal while maintaining a substantially constant supply current to the power amplifier are disclosed hereinafter.

Figure 4:
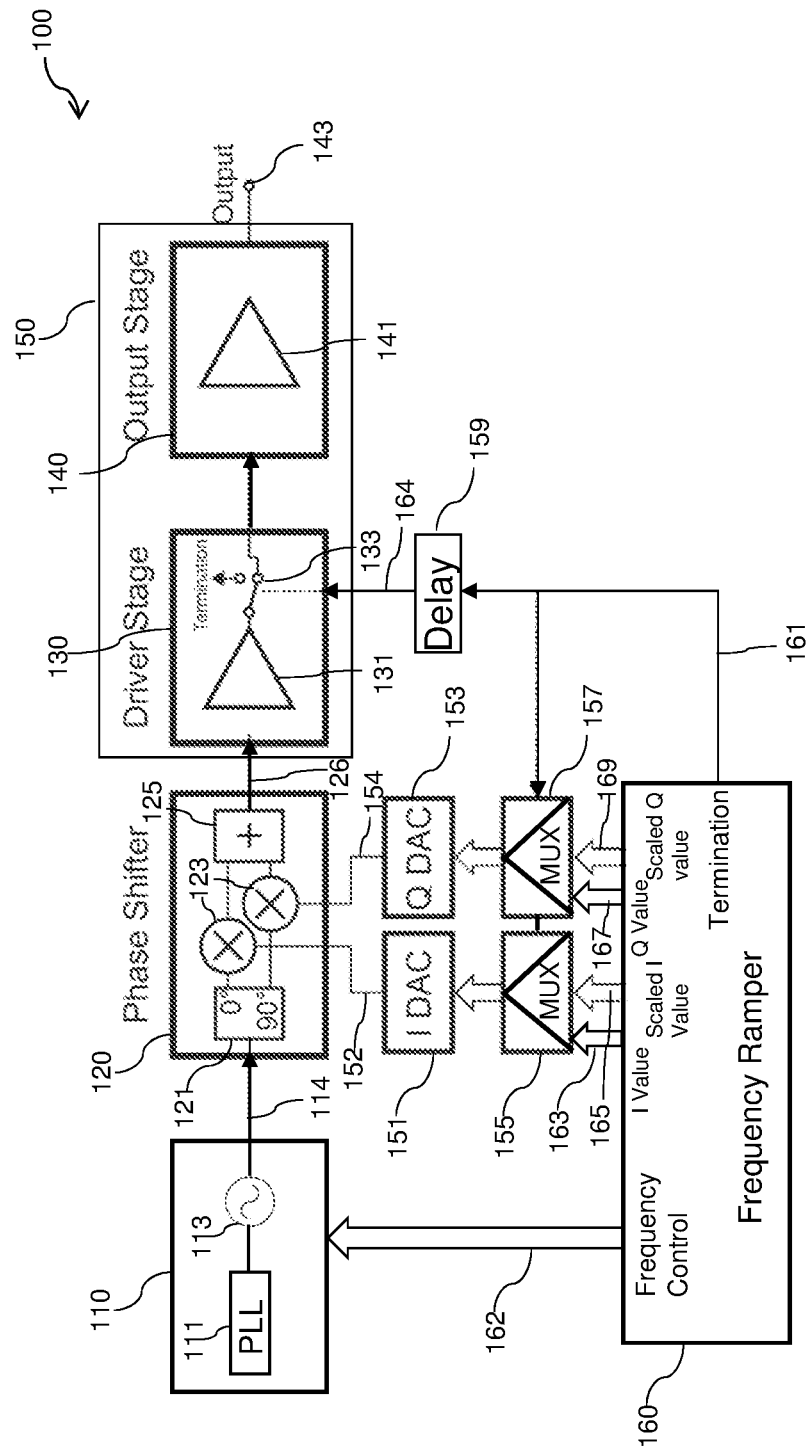
FIG. 4 illustrates a block diagram of a radio frequency (RF) transmitter, in an embodiment.

FIG. 4 illustrates a block diagram of a radio frequency (RF) transmitter 100, in an embodiment. The RF transmitter 100 may be used in the FMCW radar system to transmit the RF signal. The RF transmitter 100 may be formed in an integrated circuit (IC), such as an RFIC, an MMIC, or the like, using semiconductor manufacturing processes. For simplicity, not all features of the RF transmitter 100 are illustrated in FIG. 4. To avoid cluttering, FIG. 4 only shows one Tx channel of the RF transmitter 100, and the discussion herein focuses on one Tx channel. Skilled artisans would readily appreciate that the principle disclosed herein could be applied for any of the Tx channels of the RF transmitter 100.

Referring to FIG. 4, the RF transmitter 100 includes a frequency signal generator 110, a phase shifter 120, a power amplifier 150, digital-to-analog converters (DACs) 151/153, logic circuits 155/157, an optional delay circuit 159, and a frequency control circuit 160. The frequency signal generator 110 comprises an oscillator 113 (e.g., a voltage-controlled oscillator) for generating a frequency signal (e.g., a sinusoid signal), and comprises a phase-locked loop (PLL) 111 coupled to the oscillator 113. In some embodiments, the frequency control circuit 160 generates a frequency control signal 162 to control the PLL 111 and the oscillator 113 such that the frequency signal generator 110 generates an RF signal 114 same as or similar to the RF signal 21 in FIG. 2. The RF signal 114 is sent to an input terminal of the phase shifter 120. In the discussion herein, the term "input terminal" and "output terminal" are used to describe the physical connector(s) for inputting or outputting signals. Depending on, e.g., whether the signal is a single-ended signal or differential signal, an "input terminal" or an "output terminal" may have one or two physical connectors, as skilled artisans readily appreciate.

In some embodiments, the RF signal 114 sent to the phase shifter 120 is referred to as the in-phase (I) carrier. A phase delay circuit 121 of the phase shifter 120 introduces a 90 degree phase shift to the RF signal 114 to generate a quadrature (Q) carrier signal, which has a same frequency as, but a 90 degree phase offset from, the I carrier. The I carrier and the Q carrier are modulated by (e.g., multiplied with) the output signal 152 of the DAC 151 and the output signal 154 of the DAC 153, respectively, by the mixers 123 in the phase shifter 120. The output signal 152 of the DAC 151 may also be referred to as an in-phase (I) data signal 152, and the output signal of the DAC 153 may also be referred to as a quadrature (Q) data signal 154. The outputs of the mixers 123 are added together by a coupling circuit 125, and sent to the output terminal of the phase shifter 120 as an RF signal 126 (also referred to as a modulated RF signal). The output of the phase shifter 120 therefore includes an in-phase (I) component and a quadrature (Q) component that correspond to the modulated I carrier and the modulated Q carrier, respectively. The upper processing path and the lower processing path of the phase shifter 120 in FIG. 4 may also be referred to as the I-component RF path and the Q-component RF path, respectively.

Still referring to FIG. 4, the output of the phase shifter 120 is sent to the power amplifier 150. The power amplifier 150 may include a driver stage 130 and an output stage 140. The driver stage 130 in FIG. 4 includes two functional blocks, such as a driver 131 and a switch 133. The output stage 140 includes a driver 141, and the output of the driver 141 is coupled to an output terminal 143 of the power amplifier 150 for connection with a Tx antenna. The driver 131 (or the driver 141) may be or include an amplifier circuit that amplifies its input signal (e.g., the RF signal 126). For ease of discussion, in the discussion herein, after the RF signal 126 passes through (e.g., after being amplified by) the driver 131 (or the driver 141), the output of the driver 131 (or the driver 141) may still be referred to as the RF signal 126.

In FIG. 4, the output of the driver 131 is sent to the switch 133, which is controlled by a control signal 164 (also referred to as an enable signal). The control signal 164 is the same as the termination control signal 161 generated by the frequency control circuit 160 when the delay circuit 159 is omitted, or is a delayed version of the termination control signal 161 when the delay circuit 159 is included in the RF transmitter 100. In some embodiments, when the termination control signal 161 is de-asserted, the switch 133 passes the RF signal 126 through to the output stage 140 for transmission by a Tx antenna, and the RF transmitter 100 is said to allow (or enable) transmission of the RF signal 126. Conversely, when the termination control signal 161 is asserted, the RF signal 126 is terminated, e.g., by dumping the output of the driver 131 to a power supply, and the RF transmitter 100 is said to stop (or disable) transmission of the RF signal 126. Note that by terminating the RF signal 126 in the driver stage 130, the RF signal 126 is not sent to the output stage 140 for transmission by a Tx antenna.

In the illustrated embodiments, when the RF signal 126 is terminated in the power amplifier 150, the driver stage 130 and the output stage 140 are still turned on, such that the supply currents to the output stage 140 and the driver stage 130 remain substantially unchanged regardless of whether transmission of the RF signal 126 is enabled or not. In other words, during operation, the power consumption of the power amplifier 150 remains substantially unchanged (e.g., varies less than 10%) regardless of the status (e.g., value) of the control signal 164. For example, the power consumption of the power amplifier 150 when transmission of the RF signal 126 is disabled may be between 90% and 100%, or between 95% and 100%, of the power consumption of the power amplifier 150 when transmission of the RF signal 126 is enabled.

Although the driver 131 and the switch 133 in the block diagram of the driver stage 130 in FIG. 4 is illustrated as two separate functional blocks, the driver 131 and the switch 133 may be implemented in a single circuit. Example circuits for the driver stage 130 are discussed below with reference to FIG. 10 and FIG. 11. Furthermore, although the switch 133 is illustrated as being interposed between the driver 131 and the output stage 140, the switch 133 may be formed in the output stage 140, e.g., at the output of the driver 141. These and other variations are fully intended to be included within the scope of the present disclosure.

When transmission of the RF signal 126 is enabled, the output of the driver stage 130 is sent to the output stage 140. The driver 141 of the output stage 140 amplifies the output of the driver stage 130 so that the RF power of the RF signal 126 is strong enough for transmission by a Tx antenna, which Tx antenna is configured to be connected to the output terminal 143 of the output stage.

FIG. 4 also illustrates the frequency control circuit 160 (may also be referred to as a frequency ramper circuit). The frequency control circuit 160 generates the frequency control signal 162 used for controlling the frequency signal generator 110. In addition, the frequency control circuit 160 generates an in-phase (I) value 163 and a quadrature (Q) value 167 for each frame of the RF signal 126. In addition, the frequency control circuit 160 generates a scaled in-phase (I) value 165 and a scaled quadrature (Q) value 169, where the scaled I value 165 (or the scaled Q value 169) is the I value 163 (or the Q value 167) scaled by a scale factor smaller than 1. In some embodiments, the scale factor is zero. In some embodiments, the scale factor decreases from one to zero in a few steps (see, e.g., FIG. 8 and the discussion thereof). The scaled I value 165 and the scaled Q value 169 are used to reduce the RF power of the RF signal 126 during time periods when transmission of the RF signal is disabled, e.g., during the fly-back periods (see FIG. 2), or when a particular Tx channel is disabled (see FIG. 3).

As illustrated in FIG. 4, the I value 163 and the scaled I value 165 are sent to the logic circuit 155. The Q value 167 and the scaled Q value 169 are sent to the logic circuit 157. In some embodiments, the logic circuit 155 and the logic circuit 157 are multiplexers (MUXs)). The output of the logic circuit 155 is then converted into the I data signal 152 by the DAC 151, and the output of the logic circuit 157 is converted into the Q data signal 154 by the DAC 153. In the illustrated embodiment, the termination control signal 161 from the frequency control circuit 160 is used as a control signal to select the output of the logic circuits 155/157 (e.g., MUXs). Note that since the frequency control circuit 160 generates the frequency control signal 162, it knows exactly when transmission of the RF signal is enabled (or disabled). Therefore, the frequency control circuit 160 asserts (e.g., set to a logic high value) the termination control signal 161 during time periods when transmission of the RF signal 126 is disabled, and de-asserts (e.g., set to a logic low value) the terminal control signal 161 when transmission of the RF signal 126 is enabled. The logic circuits 155/157 (e.g., MUXs) selects the I value 163 and the Q value 167 as outputs when the termination control signal 161 is de-asserted, and selects the scaled I value 165 and the scaled Q value 169 as outputs when the termination control signal 161 is asserted.

FIG. 4 further illustrates a delay circuit 159 for introducing a pre-determined amount of delay to the termination control signal 161. The delay circuit 159 may be formed using one or more logic gates, such as AND gate, OR gate, inverter, a flip-flop, combinations thereof, or the like. The delay circuit 159 is used to reduce spectrum widening, details are discussed below. In some embodiments, the delay circuit 159 is omitted, so that the termination control signal 161 is sent directly to the driver stage 130 as the control signal of the switch 133.

Figure 5:
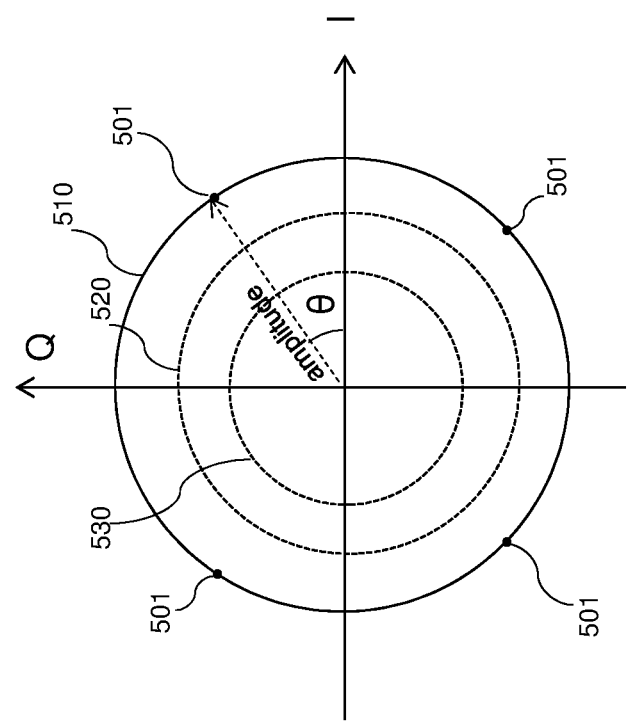
FIG. 5 illustrates a constellation of a phase-shift keying (PSK) modulation scheme, in an embodiment.

Operation of the RF transmitter 100 is discussed below with reference to FIGS. 4, 5, and 6 as an example. Referring now to FIG. 5, which illustrates a constellation of a phase-shift keying (PSK) modulation scheme, in an embodiment. For example, for a quadrature PSK (QPSK) modulation scheme, the constellation has four data points 501 (also referred to as constellation points) located on a circle 510, which data points 501 have the same amplitude but different phases (e.g., different phase angle θ). The X-axis and the Y-axis of FIG. 5 represent the I value and the Q value of the data points. The FMCW radar system may use a PSK modulation scheme in the phase shifter 120.

In some embodiments, when the termination control signal 161 is de-asserted (e.g., transmission of RF signal being enabled), the I value 165 and the Q value 167 (see FIG. 4) together select a data point in, e.g., the QPSK constellation of FIG. 5. The corresponding I data signal 152 and the Q data signal 154 are used to modulate the I carrier and the Q carrier to generate the PSK modulated RF signal 126. When the termination control signal 161 is asserted (e.g., transmission of RF signal being disabled), the scaled I value 165 and the scaled Q value 169, which have smaller amplitudes than the I value 163 and the Q value 167, respectively, are used to generate the PSK modulated RF signal 126 with smaller amplitude, or equivalent, PSK modulated RF signal 126 with lower RF power. Details are discussed below using the example in FIG. 6.

Figure 6:
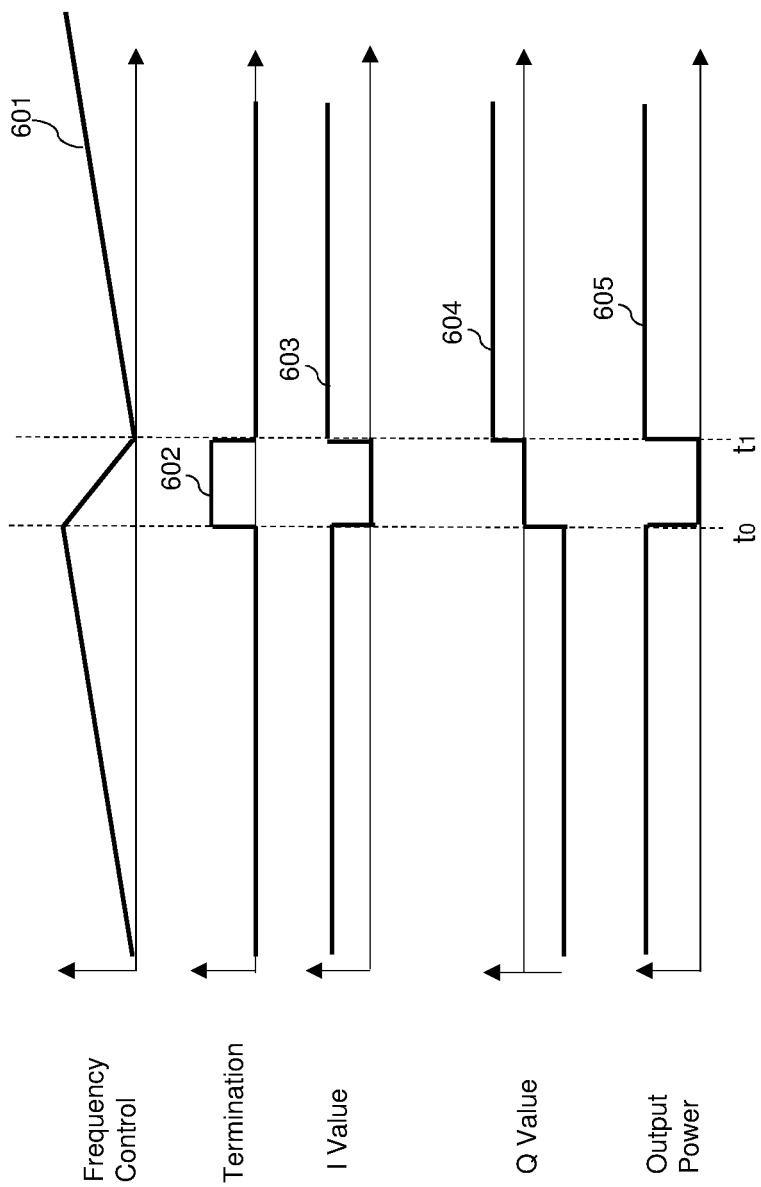
FIG. 6 illustrates a timing diagram for the RF transmitter of FIG. 4, in an embodiment.

FIG. 6 illustrates a timing diagram for the RF transmitter 100 of FIG. 4, in an embodiment. In FIG. 6, the frequency control signal 601 corresponds to the frequency control signal 162 in FIG. 4, which may have a linearly increasing value during time periods when the frequency ramp signal 21A is generated, and has a decreasing value during the fly-back periods. The termination control signal 602 in FIG. 6 corresponds to the termination control signal 161 of FIG. 4. Note that in the example of FIGS. 6, the delay circuit 159 in FIG. 4 is omitted, and therefore, the control signal 164 is the same as the terminal control signal 161. The I value 603 and the Q value 604 in FIG. 6 correspond to the input data to the DAC 151 and the input data to the DAC 153 in FIG. 4, respectively. The RF power signal 605 in FIG. 6 shows the RF power of the RF signal 126, which is proportional to the square root of the sum of the squares of the I value 603 and the Q value 604.

As illustrated in FIG. 6, before time $t_0$, the termination control signal 602 is de-asserted, the outputs of the logic circuits 155 and 157, which are shown as I value 603 and Q value 604 in FIG. 6, correspond to the I value 163 and the Q value 167 in FIG. 4, respectively. The I value 603 and the Q value 604 have non-zero values before time $t_0$ and together select a data point in, e.g., the PSK constellation of FIG. 5. The RF signal 126 generated by the phase shifter 120 during this period of time has a non-zero RF power, as indicated by the RF power signal 605.

At time $t_0$, the frequency control signal 601 starts decreasing, indicating the start of a fly-back period, and the termination control signal 602 is asserted (e.g., rises from logic low to logic high). The termination control signal 602 selects the scaled I value 167 and the scaled Q value 169 as the outputs of the logic circuits 155/157. In the example of FIG. 6, the scaled I value 167 and the scaled Q value 169 are zero when the termination control signal 602 is asserted, as indicated by the zero values for the I value 603 and the Q value 604, which results in the I data signal 152 and the Q data signal 154 in FIG. 4 having reduced amplitude (e.g., zero amplitude). As a result, the power of the RF signal 126 is reduced to zero when the termination control signal 602 is asserted. Note that setting the I value 603 and Q value 604 to zero equivalently shrinks the radius of the PSK constellation (e.g., 510) in FIG. 5 to zero.

At time $t_1$, the frequency control signal 601 starts increasing, which signals the end of the fly-back period. The termination control signal 602 is de-asserted. As a result, the I value 603 and the Q value 604 now change back to non-zeros values corresponding to the I value 163 and the Q value 167 in FIG. 4, which selects the next data point in the constellation for the next frame of the RF signal 126, and the RF power of the frequency ramp signal 21A in the next frame have the non-zero value again.

In the example of FIG. 6, the termination control signal 602 is asserted during the fly-back period. The termination control signal 602 may be asserted for a particular Tx channel during other periods of time, such as when the particular Tx channel is disabled while another Tx channel is enabled during a sweep of the Tx channels. The principle disclosed herein, which includes reducing the power of the RF signal 126 at the output of the phase shifter 120 and terminating the RF signal 126 in the power amplifier 150, can be applied for different scenarios when RF transmission is disabled. In embodiments where the delay circuit 159 is used in the RF transmitter 100 of FIG. 4, the timing diagram would otherwise be the same as FIG. 6, but with the termination control signal 602 shifted to the right by a time delay equal to the delay of the delay circuit 159. The delay introduced by the delay circuit 159 may help to reduce spectrum widening of the RF signal 126 due to the sudden changes in the I value 603 and the Q value 604, e.g., at time to and time $t_1$.

Figure 7:
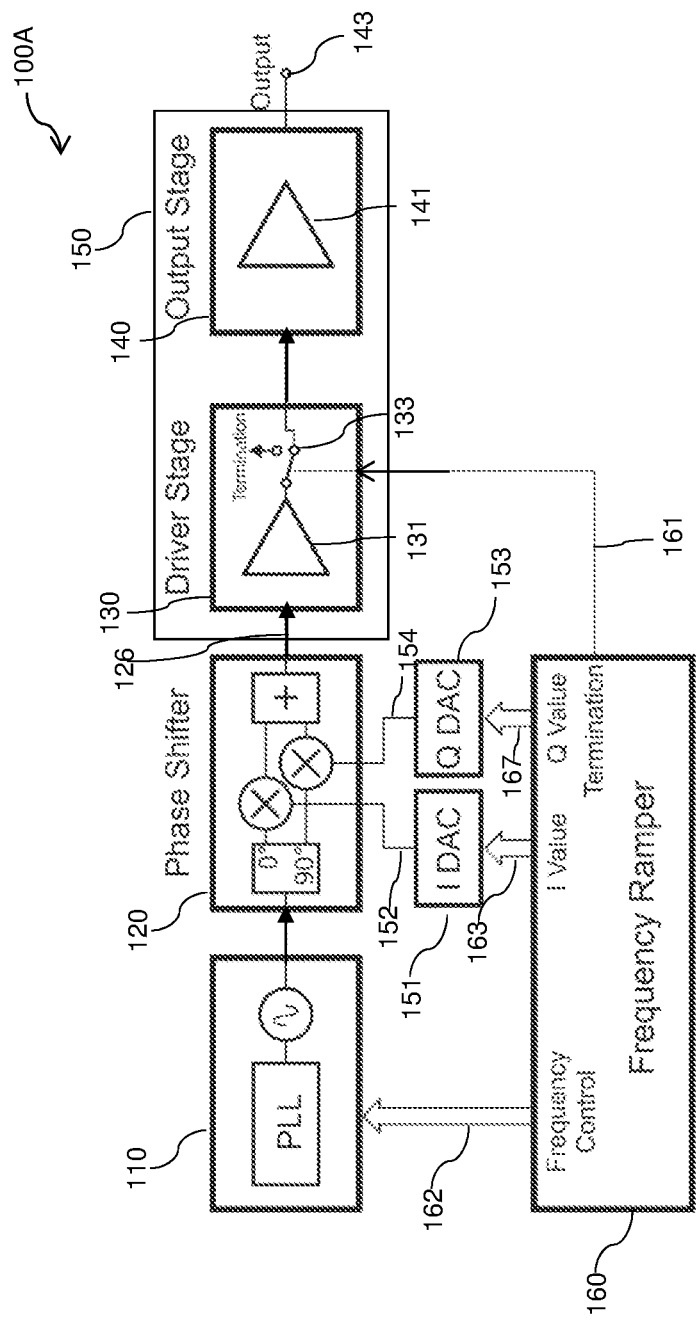
FIG. 7 illustrates a block diagram of a radio frequency (RF) transmitter, in another embodiment.

FIG. 7 illustrates a schematic diagram of an RF transmitter 100A, in another embodiment. The RF transmitter 100A is similar to the RF transmitter 100 of FIG. 4, but with the delay circuit 159 and the logic circuits 155/157 removed. In addition, the frequency control circuit 160 no longer generates the scaled I value 167 and the scaled Q value 169. In the example of FIG. 7, the I value 163 and the Q value 167 are assigned a first value and a second value, respectively, that together chose a data point in, e.g., the PSK constellation (e.g., 510) of FIG. 5 when transmission of the RF signal is enabled. During time periods when transmission of the RF signal is disabled, the I value 163 and the Q value 167 are assigned a third value and a fourth value, respectively, where the third value and the fourth value are the first value and the second value scaled by a scale factor. The scale factor may be zero, in some embodiments. In some embodiments, the scale factor changes from one to zero in a plurality of steps, such that the third value and the fourth value decrease to zero in a plurality of steps. For each scale factor smaller than one, the I value 163 and the Q value 167 effectively select a data point on a shrunken constellation, such as one indicated by the dashed circle 520 or 530 in FIG. 5. When the scale factor becomes zero, the constellation shrinks into a dot (e.g., having a zero radius) at the center of the circle 510.

The RF transmitter 100A of FIG. 7 is suitable for applications where the I value 163 and the Q value 167 are controlled by firmware, where the I value 163 and the Q value 167 are changed by, e.g., writing values to control registers of the frequency control circuit 160 using a micro-controller. The micro-controller may be integrated in the frequency control circuit 160, or may be outside of the frequency control circuit 160 and in communication with the frequency control circuit 160 through data paths.

Figure 8:
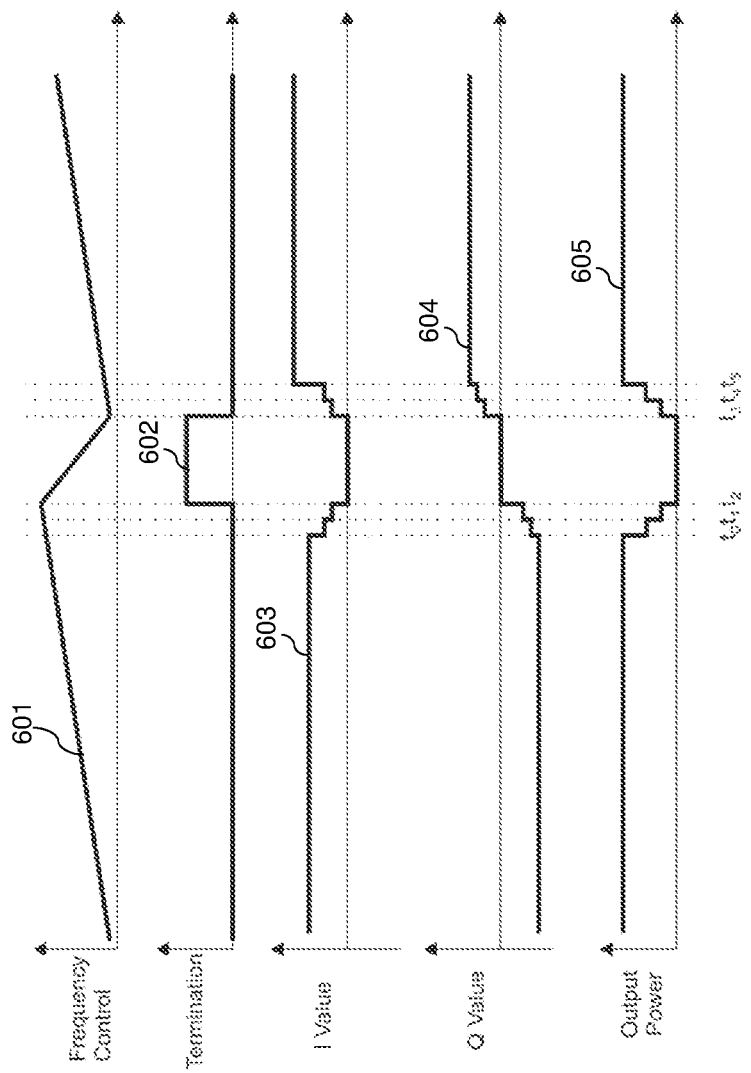
FIG. 8 illustrates a timing diagram for the RF transmitter of FIG. 7, in an embodiment.

FIG. 8 illustrates a timing diagram for the RF transmitter 100A of FIG. 7, in an embodiment. The example of FIG. 8 is similar to that of FIG. 6, with the same reference numeral referring to the same or similar signals, but the I value 603 and the Q value 604 in FIG. 8 decrease to zero before the fly-back period in a plurality of steps. In FIG. 8, a fly-back period between time $t_2$ and time $t_3$ is shown. Before the fly-back period, the I value 603 and the Q value 604 have their originally non-zero values before time to, which correspond to a non-zero, pre-determined RF power for the RF signal 126.

Still referring to FIG. 8, starting at time to, in preparation for disabling transmission of the RF signal during the fly-back period, the frequency control circuit 160 reduces the I value 603 and the Q value 604 from their respective original non-zero values to zero in a few steps from time to $t_0$ time $t_2$. The number of steps illustrated in FIG. 8 is merely a non-limiting example, the frequency control circuit 160 may decrease the I value 603 and the Q value 604 to zero in any suitable number of steps. At time $t_2$, the terminal control signal 602 is asserted, and the switch 133 in the driver stage 130 switches to a position that disconnects the output of the driver 131 from the output stage 140 and terminates the RF signal 126. The gradual, multi-step decrease to zero for the I value 603 and the Q value 604 helps to reduce the spectrum widening of the RF signal 126. As illustrated in FIG. 8, during the fly-back period from time $t_2$ to time $t_3$, the RF power of the RF signal 126 is zero. At time $t_3$, the fly-back period ends, the termination control signal 602 is de-asserted. From time $t_3$ to time $t_5$, each of the I value 603 and the Q value 604 increases from zero to a respective non-zero value for the next frame of RF signal 126 in a plurality of steps.

In the examples of FIGS. 6 and 8, during the time period when transmission of the RF signal is disabled, the switch 133 is switched to a position that terminates the RF signal 126 and disconnects the driver 131 from the driver 141, which equivalently reduces the gain of the power amplifier 150 for the RF signal 126. In addition, the RF power of the RF signal 126 is reduced (e.g., to zero) by reducing the digital values at the input of the DACs 151/153 to zero, which in turn reduces (e.g., to zero) the amplitudes of the I data signal 152 and the Q data signal 154 that modulates the I carrier and the Q carrier. The reduction of RF power of the RF signal 126, together with the termination of the RF signal 126 (or reduction of the gain of the power amplifier 150), ensures that a target amount of reduction (e.g., 20 dB, or 30 dB) in the RF power of the RF signal at the output terminal 143 is achieved. In other words, without reducing the RF power of the RF signal 126 at the output of the phase shifter 120, simply switching the switch 133 to terminate the RF signal 126 may not be enough to ensure that transmission of RF signal is stopped at the output terminal 143, as discussed below.

Due to the coupling between the driver stage 130 and the output stage 140, even when the switch 133 is at a position to terminate the RF signal 126, a leakage RF signal may still be coupled to the input terminal of the output stage 140. In advanced manufacturing technologies, the gain of the output stage 140 may be so high that the leakage RF signal, after being amplified by the gain of the output stage 140, may still be too strong to meet the performance target, e.g., of a 30 dB reduction in RF signal power at the output terminal 143 when the termination control signal 161 is asserted. Therefore, the amplified leakage RF signal may still be transmitted by the Tx antenna. The disclosed embodiments herein, by reducing the RF power of the RF signal 126 in addition to terminating the RF signal 126, ensures that the amplified leakage RF signal at the output terminal 143 is weak enough, such that the transmission of RF signal at the output stage 140 by the Tx antenna is considered to be stopped.

Figure 9:
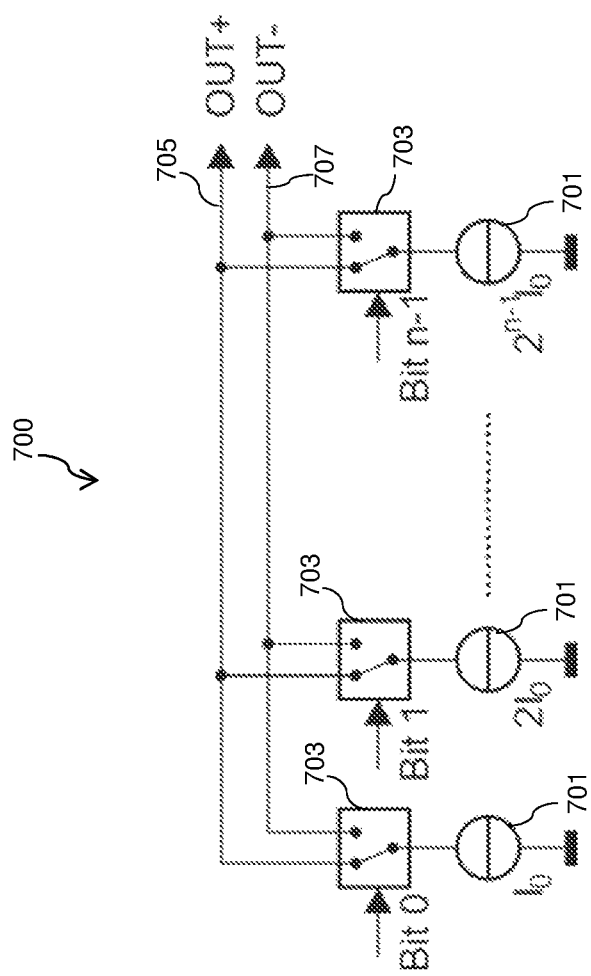
FIG. 9 illustrates a schematic diagram of a digital-to-analog converter (DAC), in an embodiment.

FIG. 9 illustrates a schematic diagram of a digital-to-analog converter (DAC) 700, in an embodiment. The DAC 700 may be used as the DACs 151 and 153 in FIG. 4 or in FIG. 7. Since the I value 163 and the Q value 167 may have a positive or a negative sign, a DAC with a differential output is used. As illustrated in FIG. 9, the DAC 700 is based on binary-weighted current sources 701 that have current values of $I_0$, $2\ I_0$, $4\ I_0$, ..., $2^{n-1}I_0$ for an n-bit DAC. Depending on the digital input value, the individual currents corresponding to different bits (e.g., bit 0, bit 1, ..., bit n−1)

are routed either to the OUT+ terminal or to the OUT− terminal. The overall current of the DAC 700 is constant during operation, regardless of the digital input value. Therefore, the DAC 700 is well suited for the RF transmitters 100 and 100A, such that the supply current to the power amplifier 150 (or the power consumption of the power amplifier 150) remain substantially constant regardless of whether transmission of the RF signal is enabled or not.

Figure 10:
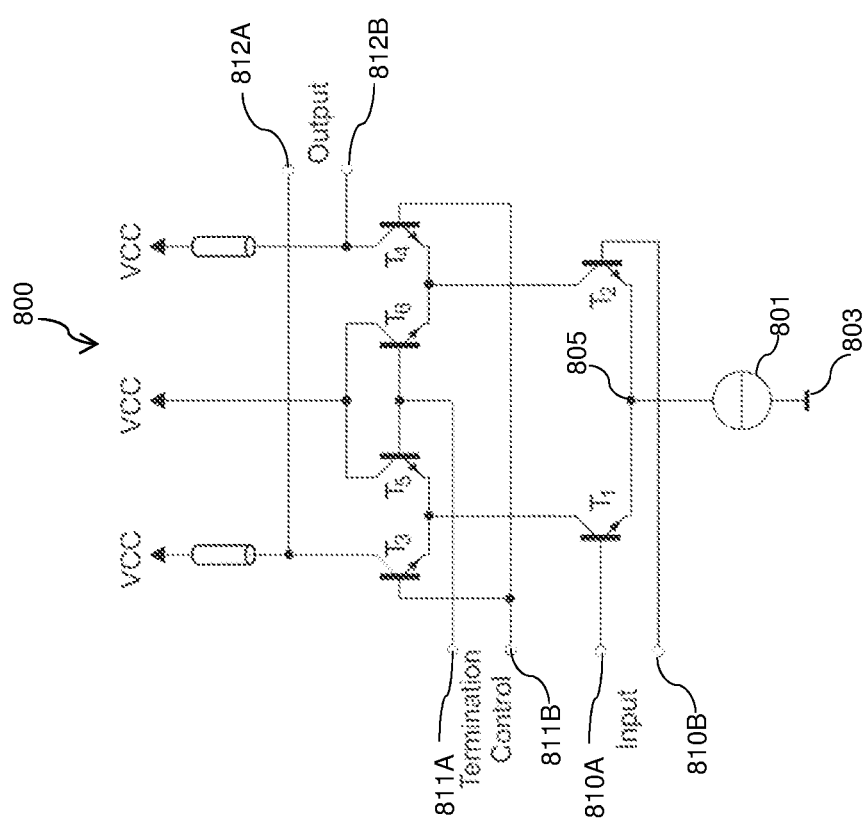
FIG. 10 illustrates a schematic diagram of a driver circuit, in an embodiment.

FIG. 10 illustrates a schematic diagram of a driver circuit 800, in an embodiment. The driver circuit 800 may be used as the driver stage 130, or the power amplifier 150, in FIG. 4 or FIG. 7. In FIG. 10, the RF input signal received at the input terminal 810 (e.g., connectors 810A and 810B) is applied to transistors T1 and T2, which serve as differential amplifiers. A current source 801 is coupled between a reference voltage node 803 (e.g., for connection to electrical ground) and a node 805 coupled to the emitter terminals of the transistors T1/T2. The output signals at the drain terminals of the transistors T1 and T2 are coupled to transistors T3-T6. The termination control signal, applied at the control terminal 811 (e.g., connectors 811A and 811B) determines which transistors are active (e.g., in the on state), and which transistors are inactive (e.g., in the off state). For example, when the termination control signal is set to a first value (e.g., 811A low and 811B high), transistors T5 and T6 are off, transistors T3 and T4 are active and together with transistors T1 and T2 serve as a cascode amplifier which provides the amplified RF signal at the output terminal 812 (e.g., connectors 812A and 812B). When the termination control signal is set to a second value (e.g., 811A high and 811B low), transistors T5 and T6 are active and dump the RF signal current to power supply VCC, transistors T3 and T4 are off, therefore the signal at the output terminal 812 is suppressed, except for a small amount of leakage signal. The driver circuit 800 thus achieves both the functions of the driver 131 and the switch 133 of the driver stage 130.

The driver circuit 800 of FIG. 10 is particularly suitable for circuits using bipolar and BiCMOS technologies. These technologies usually do not provide low-loss switches. Therefore the switching functionality of the switch 133 is implemented by re-routing the current from transistor T3/T4 to transistors T5/T6. In FIG. 10, three transistor levels are stacked (current source 801, transistors T1 and T2, and transistors T3-T6). The supply voltage for BiCMOS radar circuits is usually high enough (e.g., 3.3 V) to support such a structure.

Figure 11:
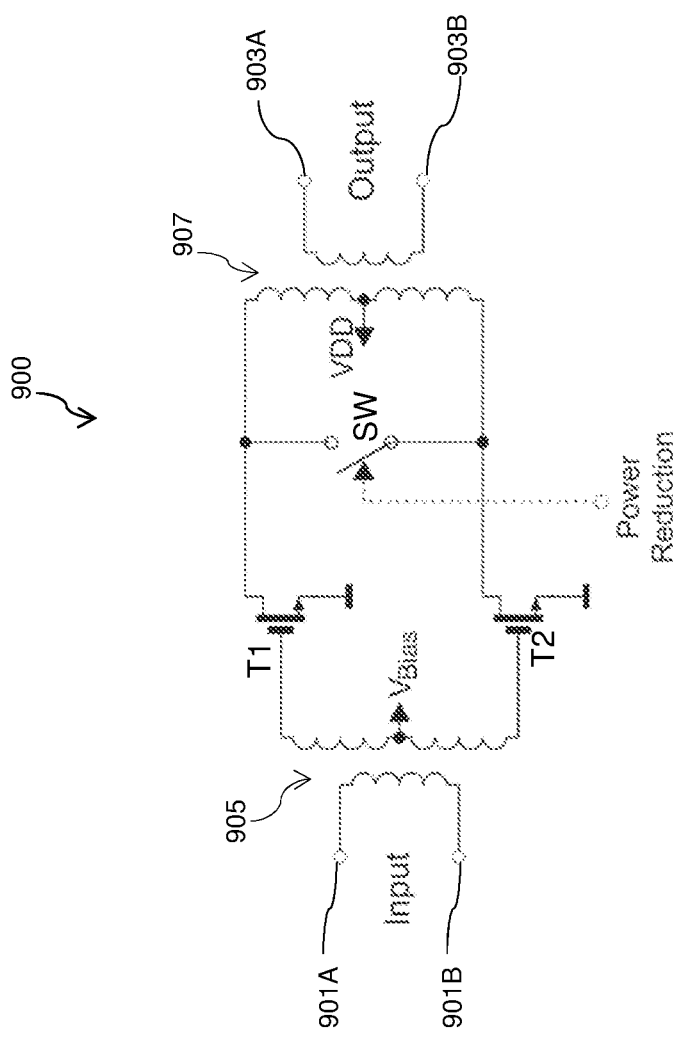
FIG. 11 illustrates a schematic diagram of a driver circuit, in another embodiment.

FIG. 11 illustrates a schematic diagram of a driver circuit 900, in another embodiment. The driver circuit 900 may be used as the driver stage 130, or the power amplifier 150, in FIG. 4 or FIG. 7. In some embodiments, circuits in advanced CMOS technologies often use low supply voltages (e.g., 0.9 V), which makes stacking of transistors difficult. However, MOS transistors with short gate length are suitable as switches for radar signals. The driver circuit 900 uses MOS transistors.

As illustrated in FIG. 11, an input transformer 905 provides a differential input signal applied at input terminal 901 (e.g., connectors 901A and 901B) to the transistors T1 and T2 via an input transformer 905. The amplified differential signal at the drain of the transistors T1 and T2 is available at the output terminal 903 (e.g., connectors 903A and 903B) via an output transformer 907. The operating current is set by applying a bias voltage $V_{Bias}$ at the center tap of the input transformer 905. The supply voltage VDD is connected to the center tap of the output transformer 907. A switch SW is located across the output transformer 907. When the switch SW is closed (e.g., controlled by the termination control signal), it creates a short circuit for the differential signal, and suppresses the RF signal at the output terminal 903. The switch SW, which may be or include a MOS transistor, can be placed across the output transformer 907, as shown here, or can be placed across the input transformer 905. The supply current of the driver circuit 900 is independent of the position (e.g., closed or open) of the switch SW.

Figure 12:
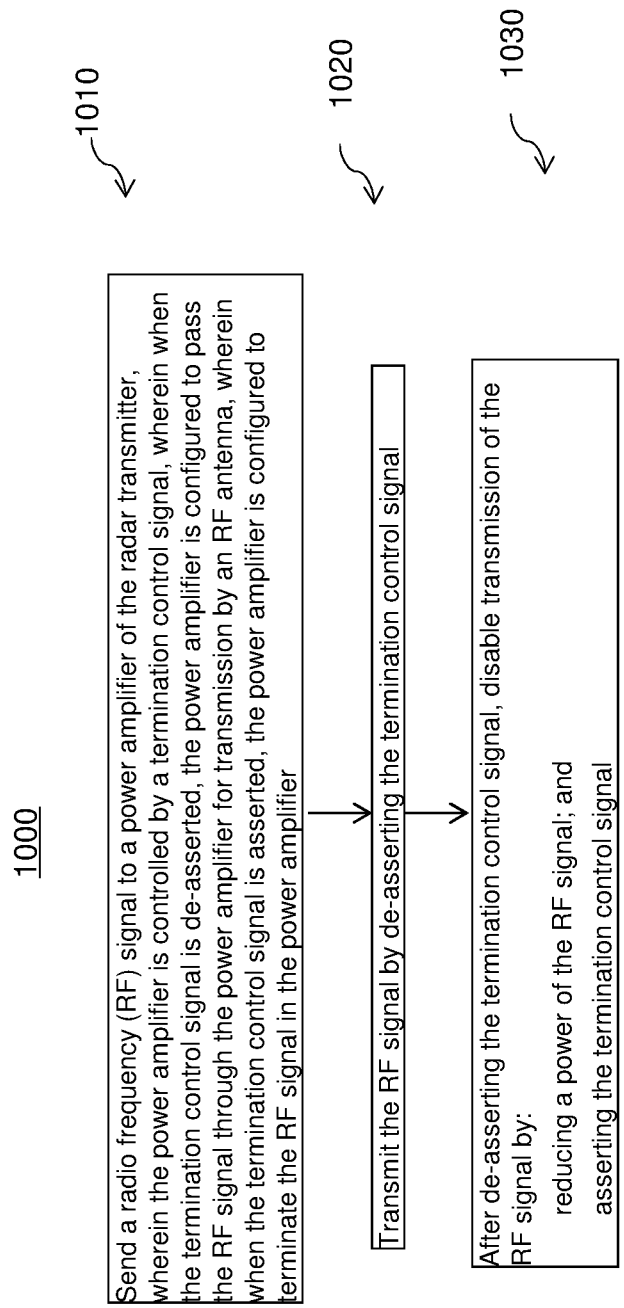
FIG. 12 illustrates a flow chart of a method of operating a radar transmitter, in some embodiments.

FIG. 12 illustrates a flow chart of a method 1000 of operating a radar transmitter, in some embodiments. It should be understood that the example method shown in FIG. 12 is merely an example of many possible example methods. One of ordinary skill in the art would recognize many variations, alternatives, and modifications. For example, various steps as illustrated in FIG. 12 may be added, removed, replaced, rearranged, or repeated.

Referring to FIG. 12, at block 1010, a radio frequency (RF) signal is sent to a power amplifier of the radar transmitter, wherein the power amplifier is controlled by a termination control signal, wherein when the termination control signal is de-asserted, the power amplifier is configured to pass the RF signal through the power amplifier for transmission by an RF antenna, wherein when the termination control signal is asserted, the power amplifier is configured to terminate the RF signal in the power amplifier. At block 1020, the RF signal is transmitted by de-asserting the termination control signal. At block 1030, after de-asserting the termination control signal, transmission of the RF signal is disabled by: reducing a power of the RF signal; and asserting the termination control signal.

Embodiments may achieve advantages as described below. In the disclosed embodiments, the power amplifier 150 remains on and has a substantially constant power consumption regardless of whether or not RF transmission is enabled. This avoids the need to turn on and off the supply current quickly in a short period of time (e.g., during fly-back periods), thus avoiding the overshoot and/or undershoot of the supply voltage. The disclosed structures and methods also avoids the local temperature variation on the radar RFIC due to different Tx channels being turning on and off, thus preventing temperature-induced phase variations in the Tx channels. By reducing the power of the RF signal 126 in addition to terminating the RF signal 126 in the power amplifier 150 when transmission of RF signal is disabled, a target amount of power reduction (e.g., 20 dB, or 30 dB) in the RF signal at the output terminal of the power amplifier 150 is achieved.

Examples of the present invention are summarized here. Other examples can also be understood from the entirety of the specification and the claims filed herein.

Example 1. In an embodiment, a method of operating a radar transmitter includes: supplying a first radio frequency (RF) signal to a phase shifter, wherein the phase shifter comprises an in-phase (I) component RF path and a quadrature (Q) component RF path, wherein the I-component RF path and the Q-component RF path are configured to generate a phase shift to the first RF signal according to a first scale factor of the I-component RF path and a second scale factor of the Q-component RF path, wherein the phase shifter is configured to generate a second RF signal at an output terminal of the phase shifter, wherein the output terminal of the phase shifter is coupled to an input terminal of a power amplifier of the radar transmitter; generating an enable signal for the power amplifier; passing the second RF signal from the phase shifter through the power amplifier by setting the enable signal for the power amplifier to a first value; setting the enable signal for the power amplifier to a second value to reduce a gain of the power amplifier; and based on setting the enable signal to the second value, reducing a power of the second RF signal by setting the first scale factor of the I-component RF path and the second scale factor of the Q-component RF path.

Example 2. The method of Example 1, wherein reducing the power of the second RF signal comprises reducing the first scale factor of the I-component RF path and the second scale factor of the Q-component RF path such that the power of the second RF signal is reduced by at least 15 dB.

Example 3. The method of Example 1, wherein a power consumption of the power amplifier remains substantially the same regardless of whether the enable signal has the first value or the second value.

Example 4. The method of Example 1, where the first RF signal comprises a plurality of frames, wherein each frame of the first RF signal comprises: a chirp signal having a frequency that changes from a first frequency value to a second frequency value during a first period of the frame; and a fly-back signal having a frequency that changes from the second frequency value to the first frequency value within a fly-back period of the frame, wherein the enable signal for the power amplifier has the second value at least partially during the fly-back period.

Example 5. The method of Example 1, wherein the phase shifter is configured to generate the second RF signal by: modulating an in-phase carrier signal with a first data signal using a first modulator, wherein the first data signal is determined by the first scale factor of the I-component RF path; modulating a quadrature carrier signal with a second data signal using a second modulator, wherein the second data signal is determined by the second scale factor of the Q-component RF path, wherein the first data signal and the second data signal are selected to provide a first phase shift; and adding a first output of the first modulator with a second output of the second modulator to generate the second RF signal.

Example 6. The method of Example 5, wherein reducing the power of the second RF signal comprises: decreasing the first scale factor of the I-component RF path; and decreasing the second scale factor of the Q-component RF path.

Example 7. The method of Example 6, wherein the first scale factor and the second scale factor are decreased to zero.

Example 8. The method of Example 6, wherein each of the first scale factor and the second scale factor is decreased to zero in one or more steps.

Example 9. The method of Example 8, wherein the first scale factor and the second scale factor change values at a same time.

Example 10. The method of Example 8, wherein a value of the enable signal alternates between the first value and the second value, wherein the value of the enable signal changes from the first value to the second value at first edges of the enable signal, wherein the first scale factor and the second scale factor are decreased to zero at or before a nearest one of the first edges of the enable signal.

Example 11. The method of Example 10, wherein the value of the enable signal changes from the second value to the first value at second edges of the enable signal, wherein the method further comprises: after the first scale factor and the second scale factor are decreased to zero, changing the first scale factor and the second scale factor from zero to non-zero values at or after a nearest one of the second edges of the enable signal.

Example 12. The method of Example 11, wherein the first scale factor and the second scale factor change from zero to the non-zero values in one or more steps.

Example 13. In an embodiment, a method of operating a monolithic microwave integrated circuit (MMIC) in a radar transmitter includes: sending a radio frequency (RF) signal to a power amplifier of the radar transmitter, wherein the power amplifier is controlled by a termination control signal, wherein when the termination control signal is de-asserted, the power amplifier is configured to pass the RF signal through the power amplifier for transmission by an RF antenna, wherein when the termination control signal is asserted, the power amplifier is configured to terminate the RF signal in the power amplifier; transmitting the RF signal by de-asserting the termination control signal; and after de-asserting the termination control signal, disabling transmission of the RF signal by: reducing a power of the RF signal; and asserting the termination control signal.

Example 14. The method of Example 13, wherein the RF signal is generated by: modulating an in-phase carrier with an in-phase data signal; and modulating a quadrature carrier with a quadrature data signal.

Example 15. The method of Example 14, wherein reducing the power of the RF signal comprises reducing a first amplitude of the in-phase data signal and reducing a second amplitude of the quadrature data signal.

Example 16. The method of Example 15, wherein before reducing the power of the RF signal, the first amplitude of the in-phase data signal has a first value, and the second amplitude of the quadrature data signal has a second value, wherein reducing the power of the RF signal comprises reducing the first amplitude from the first value to zero and reducing the second amplitude from the second value to zero.

Example 17. The method of Example 16, wherein reducing the first amplitude comprises reducing the first amplitude from the first value to zero in a step or in a plurality of steps, and wherein reducing the second amplitude comprises reducing the second amplitude from the second value to zero in a step or in a plurality of steps.

Example 18. The method of Example 16, further comprising, after disabling transmission of the RF signal, resuming transmission of the RF signal by: increasing the power of the RF signal by increasing the first amplitude from zero to a third value and by increasing the second amplitude from zero to a fourth value; and de-asserting the termination control signal.

Example 19. In an embodiment, a radar transmitter includes: a phase shifter configured to receive a first radio frequency (RF) signal at an input terminal of the phase shifter, and configured to generate a second RF signal at an output terminal of the phase shifter, wherein the phase shifter comprises an in-phase (I) component RF path and a quadrature (Q) component RF path, wherein the I-component RF path and the Q-component RF path are configured to generate a phase shift to the first RF signal according to a first scale factor for the I-component RF path and a second scale factor for the Q-component RF path; a power amplifier coupled to the output terminal of the phase shifter, wherein a control terminal of the power amplifier is configured to receive a termination control signal, wherein when the termination control signal is de-asserted, the power amplifier is configured to pass the second RF signal through the power amplifier for transmission by an antenna, wherein when the termination control signal is asserted, the power amplifier is configured to terminate the second RF signal; and a frequency control circuit, wherein the frequency control circuit is configured to generate the first scale factor, the second scale factor, and the termination control signal, wherein the frequency control circuit is configured to enable transmission of the second RF signal by: assigning a first value and a second value to the first scale factor and the second scale factor, respectively; and de-asserting the termination control signal; and configured to disable transmission of the second RF signal by: reducing the first value to zero and reducing the second value to zero; and asserting the termination control signal.

Example 20. The radar transmitter of Example 19, further comprising: a first digital-to-analog converter (DAC) and a second DAC that are coupled between the frequency control circuit and the phase shifter, wherein the first DAC and the second DAC are configured to convert the first scale factor and the second scale factor into a first data signal and a second data signal, respectively, wherein the first data signal and the second data signal are configured to be sent to modulators in the I-component RF path and the Q-component RF path of the phase shifter.

Example 21. The radar transmitter of Example 19, wherein the frequency control circuit is configured to: reduce the first value to zero in a single step or in a plurality of steps; and reduce the second value to zero in a single step or in a plurality of steps.

Example 22. The radar transmitter of Example 19, further comprising a frequency signal generator configured to generate the first RF signal, wherein the frequency control circuit is further configured to generate a frequency control signal that determines a frequency of the first RF signal.

While this invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. A method of operating a radar transmitter, the method comprising:
   supplying a first radio frequency (RF) signal to a phase shifter, wherein the phase shifter comprises an in-phase (I) component RF path and a quadrature (Q) component RF path, wherein the I-component RF path and the Q-component RF path are configured to generate a phase shift to the first RF signal according to a first scale factor of the I-component RF path and a second scale factor of the Q-component RF path, wherein the phase shifter is configured to generate a second RF signal at an output terminal of the phase shifter, wherein the output terminal of the phase shifter is coupled to an input terminal of a power amplifier of the radar transmitter;
   generating an enable signal for the power amplifier, wherein the enable signal is a binary digital control signal that alternates between a first value and a second value during operation of the radar transmitter;
   passing the second RF signal from the phase shifter through the power amplifier by setting the enable signal for the power amplifier to the first value;
   after passing the second RF signal, setting the enable signal for the power amplifier to the second value to reduce a gain of the power amplifier; and
   based on setting the enable signal to the second value, reducing a power of the second RF signal by setting the first scale factor of the I-component RF path and the second scale factor of the Q-component RF path.

2. The method of claim 1, wherein a power consumption of the power amplifier remains substantially the same regardless of whether the enable signal has the first value or the second value.

3. The method of claim 1, wherein the first RF signal comprises a plurality of frames, wherein each frame of the first RF signal comprises:
   a chirp signal having a frequency that changes from a first frequency value to a second frequency value during a first period of the frame; and
   a fly-back signal having a frequency that changes from the second frequency value to the first frequency value within a fly-back period of the frame, wherein the enable signal for the power amplifier has the second value at least partially during the fly-back period.

4. The method of claim 1, wherein the phase shifter is configured to generate the second RF signal by:
   modulating an in-phase carrier signal with a first data signal using a first modulator, wherein the first data signal is determined by the first scale factor of the I-component RF path;
   modulating a quadrature carrier signal with a second data signal using a second modulator, wherein the second data signal is determined by the second scale factor of the Q-component RF path, wherein the first data signal and the second data signal are selected to provide a first phase shift; and
   adding a first output of the first modulator with a second output of the second modulator to generate the second RF signal.

5. The method of claim 4, wherein reducing the power of the second RF signal comprises:
   decreasing the first scale factor of the I-component RF path; and
   decreasing the second scale factor of the Q-component RF path.

6. The method of claim 5, wherein each of the first scale factor and the second scale factor is decreased to zero in one or more steps.

7. The method of claim 6, wherein the first scale factor and the second scale factor change values at a same time.

8. The method of claim 1, wherein the enable signal starts changing from the first value to the second value at a first time instant, wherein the first scale factor and the second scale factor start to decrease from non-zero values to zero at or before the first time instant.

9. The method of claim 8, wherein the enable signal starts changing from the second value to the first value at a second time instant, wherein the method further comprises:
   after the first scale factor and the second scale factor are decreased to zero, starting changing the first scale factor and the second scale factor from zero to the non-zero values at or after the second time instant.

10. The method of claim 9, wherein the first scale factor and the second scale factor change from zero to the non-zero values in one or more steps.

11. The method of claim 1, wherein the power amplifier comprises a switch coupled between the input terminal of the power amplifier and an output terminal of the power amplifier, wherein the output terminal of the power amplifier is connected to an RF antenna, wherein setting the enable signal for the power amplifier to the second value opens the switch.

12. The method of claim 1, wherein reducing the power of the second RF signal comprises reducing the power of the second RF signal from a non-zero value to zero in multiple steps within a period of time, wherein the period of time starts at a first time instant and ends at a second time instant, wherein setting the enable signal for the power amplifier to the second value comprises starting changing the enable signal for the power amplifier from the first value to the second value at the second time instant.

13. A method of operating a monolithic microwave integrated circuit (MMIC) in a radar transmitter, the method comprising:
sending a radio frequency (RF) signal to an input terminal of a power amplifier of the radar transmitter, wherein the RF signal is generated by modulating an in-phase carrier with an in-phase data signal and modulating a quadrature carrier with a quadrature data signal, wherein the power amplifier is controlled by a termination control signal, wherein the termination control signal is a binary control signal, wherein when the termination control signal is de-asserted, the power amplifier is configured to pass the RF signal through the power amplifier for transmission by an RF antenna by closing a switch of the power amplifier coupled between the input terminal of the power amplifier and the RF antenna, wherein when the termination control signal is asserted, the power amplifier is configured to terminate the RF signal in the power amplifier by opening the switch;
transmitting the RF signal by de-asserting the termination control signal; and
after de-asserting the termination control signal, disabling transmission of the RF signal by:
reducing a power of the RF signal, wherein reducing the power of the RF signal comprises reducing a first amplitude of the in-phase data signal and reducing a second amplitude of the quadrature data signal; and
asserting the termination control signal.

14. The method of claim 13, wherein before reducing the power of the RF signal, the first amplitude of the in-phase data signal has a first value, and the second amplitude of the quadrature data signal has a second value, wherein reducing the power of the RF signal comprises reducing the first amplitude from the first value to zero and reducing the second amplitude from the second value to zero.

15. The method of claim 14, wherein reducing the first amplitude comprises starting, at a first time instant, reducing the first amplitude from the first value to zero in a plurality of steps, wherein reducing the second amplitude comprises starting, at the first time instant, reducing the second amplitude from the second value to zero in a plurality of steps, wherein the termination control signal is asserted at a second time instant after the first time instant.

16. The method of claim 14, further comprising, after disabling transmission of the RF signal, resuming transmission of the RF signal by:
increasing the power of the RF signal by increasing the first amplitude from zero to a third value and by increasing the second amplitude from zero to a fourth value; and
de-asserting the termination control signal.

17. The method of claim 13, wherein reducing the power of the RF signal comprises starting reducing the power of the RF signal at a first time instant, wherein asserting the termination control signal comprises starting asserting the termination control signal at a second time instant after the first time instant.

18. The method of claim 13, wherein the power amplifier has a first power consumption when the termination control signal is asserted, and has a second power consumption when the termination control signal is de-asserted, wherein a difference between the second power consumption and the first power consumption is less than 10% of the second power consumption.

19. A radar transmitter comprising:
a phase shifter configured to receive a first radio frequency (RF) signal at an input terminal of the phase shifter, and configured to generate a second RF signal at an output terminal of the phase shifter, wherein the phase shifter comprises an in-phase (I) component RF path and a quadrature (Q) component RF path, wherein the I-component RF path and the Q-component RF path are configured to generate a phase shift to the first RF signal according to a first scale factor for the I-component RF path and a second scale factor for the Q-component RF path;
a power amplifier coupled to the output terminal of the phase shifter, wherein a control terminal of the power amplifier is configured to receive a termination control signal, wherein when the termination control signal is de-asserted, the power amplifier is configured to pass the second RF signal through the power amplifier for transmission by an antenna, wherein when the termination control signal is asserted, the power amplifier is configured to terminate the second RF signal; and
a frequency control circuit, wherein the frequency control circuit is configured to generate the first scale factor, the second scale factor, and the termination control signal, wherein the frequency control circuit is configured to:
enable transmission of the second RF signal by:
assigning a first value and a second value to the first scale factor and the second scale factor, respectively; and
de-asserting the termination control signal; and
disable transmission of the second RF signal by:
reducing the first value to zero and reducing the second value to zero; and
asserting the termination control signal; and
wherein a first power consumption of the power amplifier when the termination control signal is de-asserted is substantially the same as a second power consumption of the power amplifier when the termination control signal is asserted.

20. The radar transmitter of claim 19, further comprising:
a first digital-to-analog converter (DAC) and a second DAC that are coupled between the frequency control circuit and the phase shifter, wherein the first DAC and the second DAC are configured to convert the first scale factor and the second scale factor into a first data signal and a second data signal, respectively, wherein the first data signal and the second data signal are configured to be sent to modulators in the I-component RF path and the Q-component RF path of the phase shifter.

21. The radar transmitter of claim 19, wherein the frequency control circuit is configured to:
reduce the first value to zero in a single step or in a plurality of steps; and
reduce the second value to zero in a single step or in a plurality of steps.

22. The radar transmitter of claim 21, wherein reducing the first value to zero and reducing the second value to zero comprises starting reducing the first value and the second value at a first time instant, wherein the termination control signal is asserted at a second time instant after the first time instant.

* * * * *